United States Patent
Kim et al.

(10) Patent No.: US 9,455,170 B2
(45) Date of Patent: Sep. 27, 2016

(54) DEPOSITION APPARATUS, ORGANIC LIGHT EMITTING DISPLAY APPARATUS, AND METHOD OF MANUFACTURING ORGANIC LIGHT EMITTING DISPLAY APPARATUS USING THE DEPOSITION APPARATUS

(71) Applicant: Samsung Display Co., Ltd., Yongin, Gyeonggi-Do (KR)

(72) Inventors: Sang-Youn Kim, Yongin (KR); Myung-Ki Lee, Yongin (KR); Sang-Yong Jeong, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 135 days.

(21) Appl. No.: 14/230,523

(22) Filed: Mar. 31, 2014

(65) Prior Publication Data

US 2014/0315344 A1    Oct. 23, 2014

(30) Foreign Application Priority Data

Apr. 18, 2013  (KR) .................. 10-2013-0043033

(51) Int. Cl.
*H01L 51/00* (2006.01)
*H01L 21/677* (2006.01)

(52) U.S. Cl.
CPC ........ *H01L 21/6776* (2013.01); *H01L 51/0011* (2013.01)

(58) Field of Classification Search
None
See application file for complete search history.

(56) References Cited

U.S. PATENT DOCUMENTS

| 2001/0026358 A1* | 10/2001 | Van Dijsseldonk | G03F 7/70266 355/75 |
| 2002/0102754 A1* | 8/2002 | Fujimori | C23C 14/042 438/22 |
| 2005/0030497 A1* | 2/2005 | Nakamura | G03F 7/70341 355/30 |
| 2011/0052791 A1* | 3/2011 | Jo | C23C 14/042 427/8 |
| 2012/0009328 A1 | 1/2012 | Ryu et al. | |
| 2013/0008379 A1 | 1/2013 | Chang et al. | |
| 2014/0131667 A1 | 5/2014 | Chang | |

FOREIGN PATENT DOCUMENTS

| KR | 10-2012-0006324 A | 1/2012 |
| KR | 10-2013-0004831 A | 1/2013 |
| KR | 10-2014-0060171 A | 5/2014 |

* cited by examiner

Primary Examiner — Robert Vetere
(74) Attorney, Agent, or Firm — Lee & Morse, P.C.

(57) ABSTRACT

A deposition apparatus includes a deposition unit including a plurality of deposition assemblies, which are separated from a substrate at a predetermined distance and deposit a material onto the substrate while a first transfer unit transfers the substrate. Each of the plurality of deposition assemblies includes a patterning slit sheet facing a deposition source nozzle unit, a positional information obtaining unit obtaining positional information regarding a position of the substrate transferred by the first transfer unit, and a sheet stage adjusting a position of the patterning slit sheet with respect to the substrate transferred by the first transfer unit according to the positional information.

12 Claims, 6 Drawing Sheets

DEPOSITION APPARATUS, ORGANIC LIGHT EMITTING DISPLAY APPARATUS, AND METHOD OF MANUFACTURING ORGANIC LIGHT EMITTING DISPLAY APPARATUS USING THE DEPOSITION APPARATUS

CROSS-REFERENCE TO RELATED PATENT APPLICATION

Korean Patent Application No. 10-2013-0043033, filed on Apr. 18, 2013, in the Korean Intellectual Property Office, and entitled: "Deposition Apparatus, Organic Light Emitting Display Apparatus, and Method of Manufacturing Organic Light Emitting Display Apparatus Using the Deposition Apparatus," is incorporated by reference herein in its entirety.

BACKGROUND

1. Field

Embodiments relate to a deposition apparatus, an organic light-emitting display apparatus, and a method of manufacturing the organic light-emitting display apparatus.

2. Description of the Related Art

Among display apparatuses, organic light-emitting display apparatuses have attracted much attention as next-generation display apparatuses because of a wide viewing angle, good contrast, and a fast response speed.

Organic light-emitting display apparatuses have a configuration in which an intermediate layer including an emission layer is interposed between a first electrode and a second electrode that are opposite to each other.

SUMMARY

Embodiments are directed to a deposition apparatus including a transfer unit that includes a first transfer unit and a second transfer unit, wherein the first transfer unit is configured to transfer, in a first direction, a moving unit to which a substrate is detachably fixed, and the second transfer unit is configured to transfer, in an opposite direction of the first direction, the moving unit from which the substrate is separated, so that the moving unit is cyclically transferred by the first transfer unit and the second transfer unit; and a deposition unit that includes a plurality of deposition assemblies, which are separated from the substrate at a predetermined distance and configured to deposit a material onto the substrate while the first transfer unit transfers the substrate fixed to the moving unit, and a chamber, wherein each of the plurality of deposition assemblies includes: a deposition source configured to emit a deposition material; a deposition source nozzle unit that is disposed toward the first transfer unit from the deposition source and has a deposition source nozzle formed therein; a patterning slit sheet that is disposed so as to face the deposition source nozzle unit and in which a plurality of patterning slits are disposed in one direction; a positional information obtaining unit configured to obtain positional information regarding a position of the substrate on the moving unit transferred by the first transfer unit; and a sheet stage configured to adjust a position of the patterning slit sheet with respect to the substrate on the moving unit transferred by the first transfer unit, according to the positional information obtained by the positional information obtaining unit.

The positional information obtaining unit may be configured to obtain the positional information regarding the position of the substrate on the moving unit transferred by the first transfer unit before the substrate on the moving unit transferred by the first transfer unit reaches the patterning slit sheet.

The sheet stage may adjust the position of the patterning slit sheet before the substrate on the moving unit transferred by the first transfer unit reaches the patterning slit sheet, according to the positional information obtained by the positional information obtaining unit.

The deposition unit may further include a plurality of prior deposition assemblies, which are separated from the substrate at a predetermined distance and configured to deposit a material onto the substrate while the first transfer unit transfers the substrate fixed to the moving unit, and wherein the substrate on the moving unit transferred by the first transfer unit passes through the plurality of prior deposition assemblies and then passes through the plurality of deposition assemblies.

Each of the plurality of prior deposition assemblies may include: a deposition source configured to emit a deposition material; a deposition source nozzle unit that is disposed toward the first transfer unit from the deposition source and has a deposition source nozzle formed therein; a patterning slit sheet that is disposed so as to face the deposition source nozzle unit and has an opening extending in one direction.

When the substrate on the moving unit transferred by the first transfer unit reaches the patterning slit sheet of each of the plurality of prior deposition assemblies, deposition may be performed in a state where the position of the patterning slit sheet is fixed.

Embodiments are also directed to a method of manufacturing an organic light-emitting display apparatus, the method including: transferring a moving unit into a chamber by a first transfer unit that is installed so as to enter the chamber in a state where a substrate is fixed to the moving unit; forming a layer by causing deposition materials discharged from a plurality of deposition assemblies to be sequentially deposited onto the substrate while the first transfer unit transfers the substrate with respect to the plurality of deposition assemblies in a state where the substrate is separated from the plurality of deposition assemblies disposed within the chamber at a predetermined distance; and returning the moving unit separated from the substrate by a second transfer unit that is installed so as to enter the chamber, wherein each of the plurality of deposition assemblies includes: a deposition source configured to emit the deposition material; a deposition source nozzle unit that is disposed toward the first transfer unit from the deposition source and has a deposition source nozzle formed therein; a patterning slit sheet that is disposed so as to face the deposition source nozzle unit and in which a plurality of patterning slits are disposed in one direction; a positional information obtaining unit configured to obtain positional information regarding a position of the substrate on the moving unit transferred by the first transfer unit; and a sheet stage configured to adjust a position of the patterning slit sheet with respect to the substrate on the moving unit transferred by the first transfer unit, and wherein the forming of a layer includes forming a layer while adjusting the position of the patterning slit sheet by the sheet stage, according to the positional information obtained by the positional information obtaining unit.

The forming of a layer may include forming a layer by causing, in each of the plurality of deposition assemblies, the positional information obtaining unit to obtain the positional information regarding the position of the substrate on the moving unit transferred by the first transfer unit before the substrate on the moving unit transferred by the first transfer unit reaches the patterning slit sheet.

The forming of a layer may include forming a layer by causing, in each of the plurality of deposition assemblies, the sheet stage to adjust the position of the patterning slit sheet before the substrate on the moving unit transferred by the first transfer unit reaches the patterning slit sheet, according to the positional information obtained by the positional information obtaining unit.

The forming of a layer may include forming a layer by causing the deposition materials discharged from the plurality of prior deposition assemblies to be sequentially deposited onto the substrate while the first transfer unit transfers the substrate with respect to the plurality of prior deposition assemblies in a state where the plurality of prior deposition assemblies disposed within the chamber are separated from the substrate at a predetermined distance, and then by causing the deposition materials discharged from the plurality of deposition assemblies to be sequentially deposited onto the substrate.

Each of the plurality of prior deposition assemblies may include: a deposition source configured to emit the deposition material; a deposition source nozzle unit that is disposed toward the first transfer unit from the deposition source and has a deposition source nozzle formed therein; a patterning slit sheet that is disposed so as to face the deposition source nozzle unit and has an opening extending in one direction.

The forming of a layer may include causing deposition to be performed in a state where the position of the patterning slit sheet is fixed, when the substrate on the moving unit transferred by the first transfer unit reaches the patterning slit sheet of each of the plurality of prior deposition assemblies.

Embodiments are also directed to an organic light-emitting display apparatus including: a substrate; a plurality of thin film transistors that are disposed on the substrate; a plurality of pixel electrodes that are electrically connected to the thin film transistor; a plurality of deposition layers that are disposed on the pixel electrodes; and a counter electrode that is disposed on the deposition layers, wherein at least one of the deposition layers has a linear pattern that is formed using the deposition apparatus.

The substrate may have a size of equal to or more than 40 inches.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
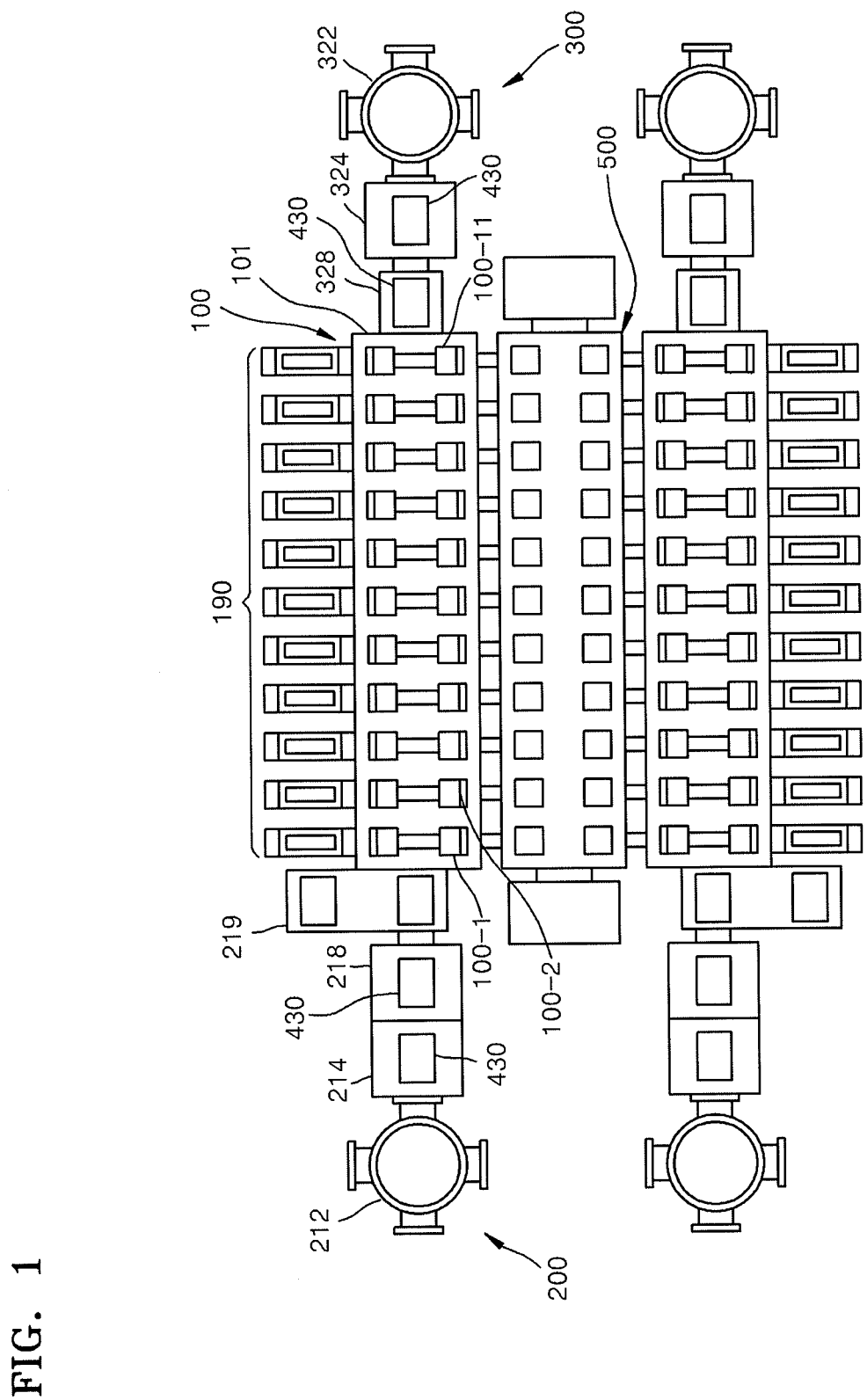
FIG. 1 illustrates a schematic conceptual plan view showing a deposition apparatus, according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

In the following embodiments, an x-axis, a y-axis, and a z-axis are not limited to three axes on an orthogonal coordinates system, and may be analyzed in a broader sense including them. For example, the x-axis, the y-axis, and the z-axis may cross at right angles to each other, but may refer to different directions that do not cross at right angles to each other.

It will also be understood that when a layer is referred to as being "on" another layer or substrate, it can be directly on the other layer or substrate, or intervening layers may also be present. As used herein, the term "and/or" includes any and all combinations of one or more of the associated listed items. Expressions such as "at least one of," when preceding a list of elements, modify the entire list of elements and do not modify the individual elements of the list.

Figure 2:
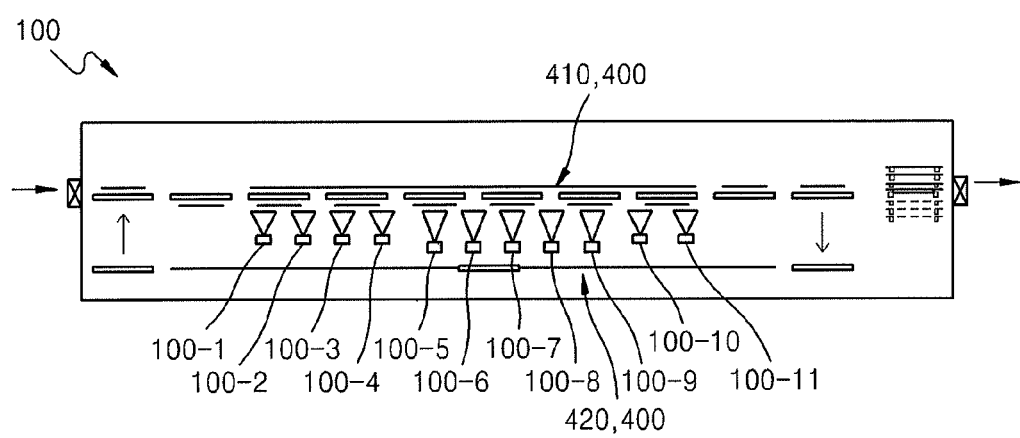
FIG. 2 illustrates a schematic conceptual side view showing a deposition portion and the like of the deposition apparatus shown in FIG. 1.

FIG. 1 illustrates a schematic conceptual plan view showing a deposition apparatus, according to an example embodiment, and FIG. 2 is a schematic conceptual side view showing a deposition portion and the like of the deposition apparatus shown in FIG. 1.

In the example embodiment shown in FIGS. 1 and 2, the deposition apparatus includes a deposition unit 100, a loading unit 200, an unloading unit 300, a transfer unit 400, and a patterning slit sheet replacement unit 500. The transfer unit 400 may include a first transfer unit 410 and a second transfer unit 420. The first transfer unit may transfer a moving unit 430 to which a substrate 2 (see FIG. 3 and the like) is detachably fixed in a first direction, and the second transfer unit 420 may transfer the moving unit 430 from which the substrate 2 is separated in a direction opposite to the first direction.

The loading unit 200 may include a first rack 212, an introduction room 214, a first inversion room 218, and a buffer room 219.

According to the present example embodiment, the plurality of substrates 2 to be deposited are stacked in the first rack 212. An introduction robot holds the substrate 2 from the first rack 212, and causes the substrate 2 to be mounted in the moving unit 430 which is transferred by the second transfer unit 420 and is located within the introduction room 214. The substrate 2 may be fixed to the moving unit 430 by using a clamp or the like, and the moving unit 430 to which the substrate 2 is fixed is moved to the first inversion room 218. In an implementation, a process of aligning the substrate 2 with respect to the moving unit 430 may be performed when necessary before fixing the substrate to the moving unit 430.

A first inversion robot reverses the moving unit 430 in the first inversion room 218 that is located adjacent to the introduction room 214. As a result, the introduction robot loads the substrate 2 on a top surface of the moving unit 430, and the moving unit 430 is transferred to the first inversion room 218 in a state where a surface opposite to a surface facing the moving unit 430 of the substrate 2 faces upward. Then, the first inversion robot reverses the first inversion room 218, and thus a surface opposite to a surface facing the moving unit 430 of the substrate 2 faces downward. In this state, the first transfer unit 410 transfers the moving unit 430 to which the substrate 2 is fixed.

The unloading unit 300 is configured in an opposite manner to the above-mentioned loading unit 200. A second inversion robot reverses the substrate 2 and the moving unit 430 that pass through the deposition unit 100 in a second inversion room 328, and transfers the reversed substrate and moving unit to a discharge room 324. Then, the substrate 2 is separated from the moving unit 430 in the discharge room 324, and the substrate from which a discharge robot and the like are separated is stacked in a second rack 322. The second transfer unit 420 transfers the moving unit 430 separated from the substrate 2 to the loading unit 200.

In an implementation, the substrate 2 may be fixed to a lower surface of the moving unit 430 from when the substrate 2 is first fixed to the moving unit 430, and may be transferred as it is. In this case, for example, the first inversion robot of the first inversion room 218 and the second inversion robot of the second inversion room 328 may be omitted. In addition, the first inversion robot of the first inversion room 218 and the second inversion robot of the second inversion room 328 may not reverse the first inversion room 218 or the second inversion room 328, but may reverse only the moving unit 430 to which the substrate 2 is fixed within the first inversion room 218 or the second inversion room 328. In this case, a method may be used of rotating the transfer unit within the inversion room 180 degrees in a state where the moving unit 430 is located on the transfer unit within the inversion room where the moving unit 430 to which the substrate 2 is fixed. At this time, it may be understood that the transfer unit within the inversion room also serves as the first inversion robot or the second inversion robot. Here, the transfer unit within the inversion room may be a part of the first transfer unit or the second transfer unit.

The deposition unit 100 includes a chamber 101 as shown in FIGS. 1 and 2, and a plurality of deposition assemblies 100-5 to 100-9 may be disposed within the chamber 101. As shown in the drawings, a plurality of prior deposition assemblies 100-1 to 100-4 and a plurality of post deposition assemblies 100-10 and 100-11 may be disposed within the chamber 101 in addition to the plurality of deposition assemblies 100-5 to 100-9. The number of plurality of deposition assemblies 100-5 to 100-9, plurality of prior deposition assemblies 100-1 to 100-4, and/or plurality of post deposition assemblies 100-10 and 100-11 may vary according to deposition materials and deposition conditions.

The plurality of prior deposition assemblies 100-1 to 100-4, the plurality of deposition assemblies 100-5 to 100-9, and the plurality of post deposition assemblies 100-10 and 100-11 may be sequentially disposed within the deposition unit 100 in the direction of the unloading unit 300 from the loading unit 200. The chamber 101 may be maintained in a vacuum state or a state close to vacuum while the deposition is performed.

The first transfer unit 410 sequentially transfers the moving unit 430 to which the substrate 2 is fixed to at least the deposition unit 100, e.g., to the loading unit 200, the deposition unit 100, and the unloading unit 300. The second transfer unit 420 returns the moving unit 430 separated from the substrate 2 in the unloading unit 300 to the loading unit 200. Thus, the moving unit 430 may be cyclically transferred by the first transfer unit 410 and the second transfer unit 420.

The first transfer unit 410 may be disposed so as to enter the chamber 101 when passing through the deposition unit 100, and the second transfer unit 420 may be disposed so as to transfer the moving unit 430 from which the substrate 2 is separated.

The first transfer unit 410 and the second transfer unit 420 may be vertically disposed. Thus, the moving unit 430 is formed so as to cause deposition to be performed on the substrate 2 while passing through the first transfer unit 410 is separated from the substrate 2 in the unloading unit 300, and so as to be returned to the loading unit 200 via the second transfer unit 420 disposed below the first transfer unit 410, thereby increasing space utilization efficiency. In an implementation, the second transfer unit 420 may be located above the first transfer unit 410 (not shown).

When the first transfer unit 410 transfers the moving unit 430, the substrate 2 fixed to the moving unit 430 passes through the plurality of prior deposition assemblies 100-1 to 100-4, the plurality of deposition assemblies 100-5 to 100-9, and the plurality of post deposition assemblies 100-10 and 100-11 in this order.

As shown in FIG. 1, the deposition unit 100 may include deposition source replacement units 190 that are respectively disposed at one side of the plurality of prior deposition assemblies 100-1 to 100-4, the plurality of deposition assemblies 100-5 to 100-9, and the plurality of post deposition assemblies 100-10 and 100-11. Although not shown in detail in the drawings, the deposition source replacement unit 190 may be formed as a cassette type deposition source replacement unit so as to be extracted from each of the plurality of prior deposition assemblies 100-1 to 100-4, the plurality of deposition assemblies 100-5 to 100-9, and the plurality of post deposition assemblies 100-10 and 100-11, thereby allowing a deposition source 100 (see FIG. 3) of each of the plurality of prior deposition assemblies 100-1 to 100-4, the plurality of deposition assemblies 100-5 to 100-9, and the plurality of post deposition assemblies 100-10 and 100-11 to be easily replaced.

Further, in FIG. 1, two deposition apparatuses each including the loading unit 200, the deposition unit 100, the unloading unit 300, and the transfer unit 400 are arranged in parallel with each other. In this case, the patterning slit sheet replacement unit 500 may be disposed between the two deposition apparatuses. That is, the two deposition apparatuses may commonly use the patterning slit sheet replacement unit 500, thereby improving space utilization efficiency, as compared with a case where each deposition apparatus separately includes the patterning slit sheet replacement unit 500.

Figure 3:
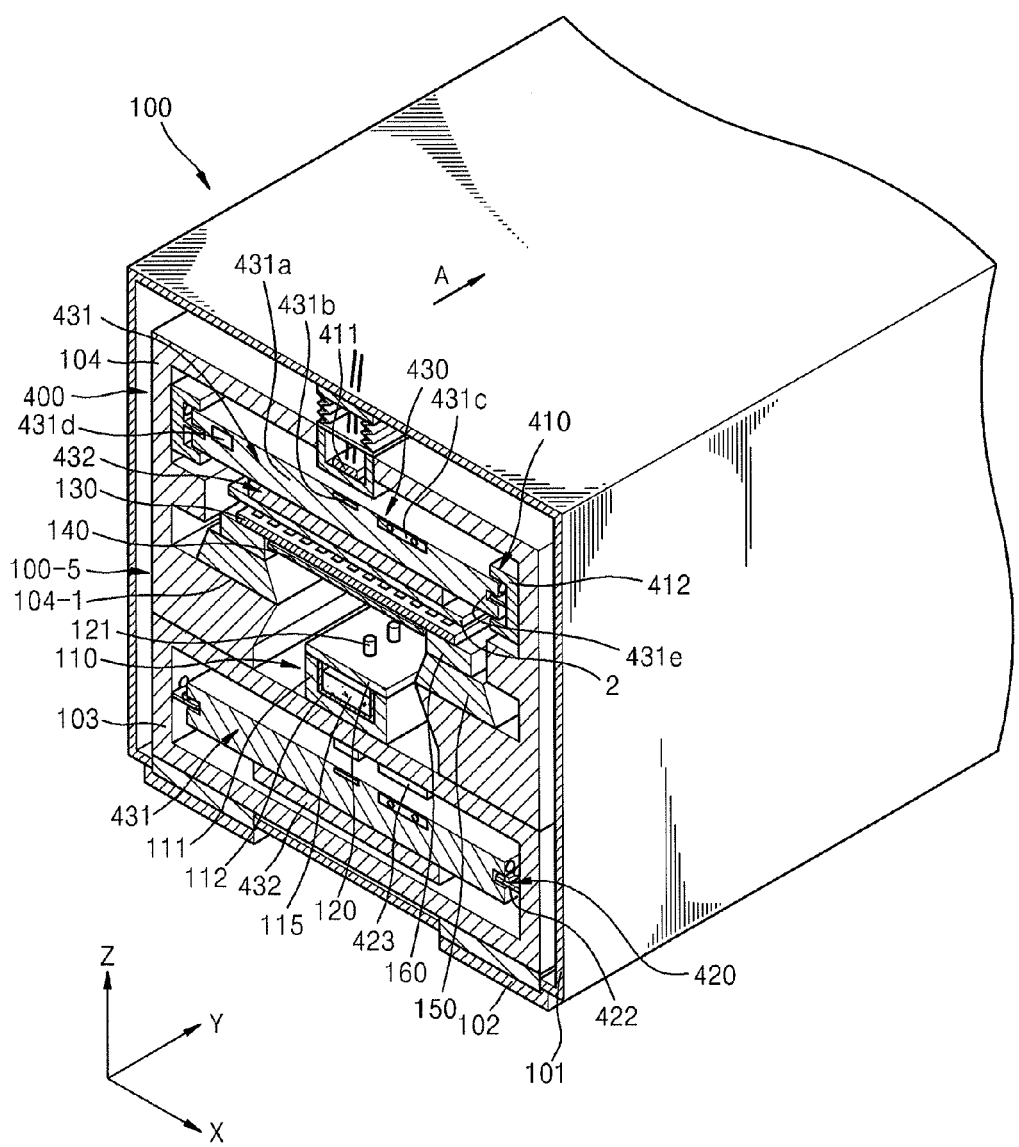
FIG. 3 illustrates a schematic perspective cross-sectional view showing a part of the deposition portion of the deposition apparatus shown in FIG. 1.
Figure 4:
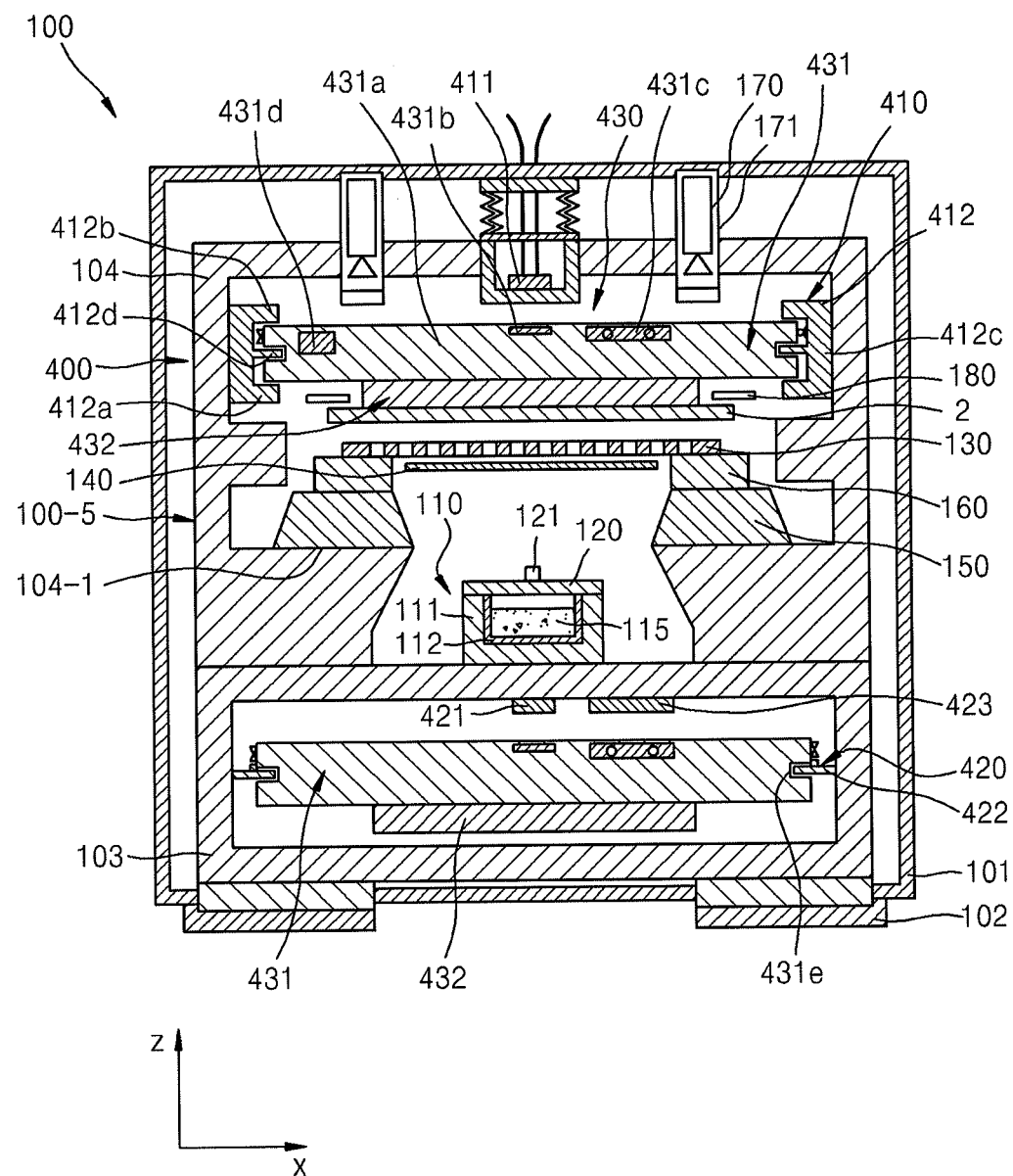
FIG. 4 illustrates a schematic cross-sectional view showing a part of the deposition portion of the deposition apparatus shown in FIG. 1.

FIG. 3 illustrates a schematic perspective cross-sectional view showing a part of the deposition portion of the deposition apparatus shown in FIG. 1. FIG. 4 is a schematic cross-sectional view showing a part of the deposition portion of the deposition apparatus shown in FIG. 1. FIGS. 3 and 4 illustrate a schematic perspective cross-sectional view and a schematic cross-sectional view showing a portion where the deposition assembly 100-5 is located, in the plurality of prior deposition assemblies 100-1 to 100-4, the plurality of deposition assemblies 100-5 to 100-9, and the plurality of post deposition assemblies 100-10 and 100-11.

The chamber 101 is formed in the form of a hollow box, and accommodates the deposition assembly 100-5 and other deposition assemblies therein. As shown in the drawings, the transfer unit 400 may also be accommodated in the chamber 101, and may enter the chamber 101 so that the transfer unit 400 extends from the outside of the chamber 101 to the inside of the chamber 101 and from the inside of the chamber 101 to the outside of the chamber 101.

A lower housing 103 and an upper housing 104 may be accommodated in the chamber 101. For example, the lower housing 103 may be disposed on a foot 102 that may be fixed to the ground, and the upper housing 104 may be disposed on the lower housing 103. A connection portion between the lower housing 103 and the chamber 101 may be sealed so as to completely block the inside of the chamber 101 from the outside. The lower housing 103 and the upper housing 104 may be disposed on the foot 102 fixed to the ground, and thus even if the chamber 101 repeatedly contracts or expands, the lower housing 103 and the upper housing 104 may maintain their fixed positions, thereby allowing the lower housing 103 and the upper housing 104 to perform a function as a kind of reference frame within the deposition unit 100.

The deposition assembly 100-5 and the first transfer unit 410 of the transfer unit 400 may be disposed within the upper housing 104, and the second transfer unit 420 of the transfer unit 400 may be disposed within the lower housing 103. The moving unit 430 may cause deposition to be continuously performed on the substrate 2 fixed to the moving unit 430 while being circularly transferred by the first transfer unit 410 and the second transfer unit 420. The moving unit 430 capable of being circularly transferred may include a carrier 431 and an electrostatic chuck 432 coupled to the carrier 431.

The carrier 431 may include a body portion 431a, a linear motor system (LMS) magnet 431b, a contactless power source (CPS) module 431c, a power source 431d, and a guide groove 431e. The carrier 431 may further include a cam follower, and the like according to the particular implementation.

The body portion 431a constitutes a base portion of the carrier 431, and may be formed of a magnetic body such as iron. The body portion 431a of the carrier 431 may cause the carrier 431 to be separated from the guide unit 412 of the first transfer unit 410 at a predetermined distance, by gravity or repulsion with a magnetic levitation bearing (not shown) included in the first transfer unit 410. Further, a guide groove 431e may be formed at both sides of the body portion 431a. The guide groove 431e may accommodate a guide protrusion 412d of the guide unit 412 or a roller guide 422 of the second transfer unit 420.

Further, the body portion 431a may include a magnetic rail 431b disposed along a central line of a traveling direction (Y-axis direction). The magnetic rail 431b of the body portion 431a may constitute a linear motor in conjunction with a coil 411 of the first transfer unit 410, and the carrier, that is, the moving unit 430 may be transferred in a direction of A by the linear motor. Thus, even though the moving unit 430 does not include a separate power source, the moving unit 430 may be transferred by a current applied to the coil 411 of the first transfer unit 410. For this, a plurality of the coils 411 may be disposed at equal intervals (along a Y-axis direction) within the chamber 101. The coil 411 may be installed in an atmosphere state because the coil 411 is disposed within an atmosphere box.

The body portion 431a may include a CPS module 431c and a power source 431d that are respectively disposed on one side and the other side of the magnetic rail 431b. The power source 431d includes a kind of rechargeable battery for supplying a power source so that the electrostatic chuck 432 chucks the substrate 2 and maintain the chucking of the substrate 2. The CPS module 431c is a wireless charging module for charging the rechargeable battery of the power source 431d. A charging track 423 included in the second transfer unit 420 is connected to an inverter (not shown), and thus a magnetic field is formed between the charging track 423 and the CPS module 431c when the second transfer unit 420 transfers the carrier 431 so as to supply power to the CPS module 431c, thereby allowing the power source 431d to be charged.

The electrostatic chuck 432 may include a body formed of ceramic, and an electrode that is buried in the body and to which a power source is applied. In the electrostatic chuck 432, a high voltage is applied to the electrode buried in the body from the power source 431d within the body portion 431a of the carrier 431, thereby allowing the substrate 2 to be attached to the surface of the body.

The first transfer unit 410 has the above-mentioned configuration, and may transfer the moving unit 430 to which the substrate is fixed in a first direction (+Y direction). The first transfer unit 410 includes the above-mentioned coil 411 and guide unit 412, and may further include a magnetic levitation bearing, a cap sensor, and the like.

The coil 411 and the guide unit 412 may be disposed on an internal surface of the upper housing 104. For example, the coil 411 may be disposed on the upper internal surface of the upper housing 104, and the guide unit 412 may be disposed on both side internal surfaces of the upper housing 104.

As described above, the coil 411 may constitute a linear motor in conjunction with the magnetic rail 431b of the body portion 431a of the moving unit 430 so as to cause the moving unit 430 to move. The guide unit 412 may guide the moving unit 430 so as to be transferred in the first direction (Y-axis direction) when the moving unit 430 moves. The guide unit 412 may be disposed so as to enter the deposition unit 100.

The guide unit 412 may accommodate both sides of the carrier 431 of the moving unit 430 and guide the carrier 431 so as to move along the A direction of FIG. 3. The guide unit 412 may include a first accommodation portion 412a disposed below the carrier 431, a second accommodation portion 412b disposed above the carrier 431, and a connection portion 412c that connects the first accommodation portion 412a and the second accommodation portion 412b to each other. An accommodation groove may be formed by the first accommodation portion 412a, the second accommodation portion 412b, and the connection portion 412c. The guide unit 412 may include a guide protrusion 412d within the accommodation groove.

The magnetic levitation bearing (not shown) may be disposed within the connection portion 412c of the guide unit 412 so as to correspond to each of the both sides of the carrier 431. The magnetic levitation bearing generates a gap between the carrier 431 and the guide unit 412 so that the carrier 431 is transferred along the guide unit 412 in a non-contact manner without coming into contact with the guide unit 412 when the carrier 431 is transferred. The magnetic levitation bearing may also be disposed in the second accommodation portion 412b of the guide unit 412 so as to be located above the carrier 431. In this case, the magnetic levitation bearing may cause the carrier 431 to move along the guide unit 412 while the carrier 431 maintains a predetermined distance with the first accommodation portion 412a and the second accommodation portion 412b without coming into contact with the first accommodation portion 412a and the second accommodation portion 412b. In order to check the gap between the carrier 431 and the guide unit 412, the guide unit 412 may include a gap sensor (not shown) disposed in the first accommodation portion 412a and/or the connection portion 412c so as to correspond to a lower portion of the carrier 431. Magnetism of the magnetic levitation bearing is changed according to values measured by the gap sensor so as to adjust the gap between the carrier 431 and the guide unit 412 in real time. Thus, the carrier 431 may be precisely transferred by feedback control using the magnetic levitation bearing and the gap sensor.

The second transfer unit 420 returns the moving unit 430 on which the deposition is completed while passing through the deposition unit 100 and from which the substrate 2 is separated in the unloading unit 300, to the moving unit. The second transfer unit 420 may include the coil 421 disposed in the lower housing 103, the roller guide 422, and the above-mentioned charging track 423. For example, the coil 421 and the charging track 423 may be disposed on an upper internal surface of the lower housing 103, and the roller guide 422 may be disposed on both side internal surfaces of the lower housing 103. The coil 421 may be disposed within an atmosphere box, similar to the coil 411 of the first transfer unit 410 (not shown).

Similarly to the coil 411, the coil 421 may constitute a linear motor in conjunction with the magnetic rail 431b of the carrier 431 of the moving unit 430. The coil 421 may cause the moving unit 430 to move in a direction (−Y direction) opposite to the first direction (+Y direction) by the linear motor.

The roller guide 422 guides the carrier 431 so as to be transferred in a direction opposite to the first direction. The roller guide 422 may be disposed so as to enter the deposition unit 100. The roller guide 422 may support a cam follower (not shown) disposed at both sides of the carrier 431 of the moving unit 430, and may guide the moving unit 430 so as to be transferred in a direction (−Y direction) opposite to the first direction (+Y direction).

The second transfer unit 420 returns the moving unit 430 separated from the substrate 2 in a direction of the loading unit 200. Thus, the second transfer unit 420 may operate with a lower positional accuracy of the moving unit 430 to be transferred, as compared with the first transfer unit 410 that transfers the moving unit 430 to which the substrate 2 is fixed so as to perform deposition on the substrate 2. Therefore, a high positional accuracy of the moving unit 430 may be ensured by applying a magnetic levitation function to the first transfer unit 410 requiring a high positional accuracy of the moving unit 430 to be transferred, and a roll type method of the related art may be applied to the second transfer unit 420, thereby simplifying the configuration of the deposition apparatus and reducing a manufacturing cost. If another implementation, the magnetic levitation function may also be applied to the second transfer unit 420.

The deposition assembly 100-5, which is separated from the substrate 2 at a predetermined distance, deposits the substrate 2 with a material, while the first transfer unit 410 transfers the substrate 2 fixed to the moving unit 430 in the first direction (+Y direction).

Hereinafter, a detailed configuration of the deposition assembly 100-5 will be described.

Each of the plurality of deposition assemblies 100-5 to 100-9 may include a deposition source 110, a deposition source nozzle unit 120, a patterning slit sheet 130, a blocking member 140, a first stage 150, a second stage 160, a camera 170, a sensor 180, and the like. Here, most components shown in FIGS. 3 and 4 may be disposed within the chamber 101 in which an appropriate degree of vacuum is maintained in order to ensure straightness of a deposition material.

The deposition source 110 may emit a deposition material. The deposition source 110, which is disposed in a lower portion of the deposition assembly, may emit a deposition material 115 in a direction (for example, upward in a +Z direction) of the substrate 2 as the deposition material 115 is sublimated or evaporated. For example, the deposition source 110 may include a furnace 111 in which the deposition material 115 is filled, and a heater 112 for evaporating the deposition material 115 filled in the furnace 111 by heating the furnace 111.

The deposition source nozzle unit 120 having a deposition source nozzle 121 formed therein is disposed in the deposition source 110 toward the first transfer unit 410 (+Z direction), that is, in a direction of the substrate 2. In the drawing, the deposition source nozzle unit 120 includes a plurality of the deposition source nozzles 121. In the plurality of deposition assemblies 100-5 to 100-9, a layer patterned on the substrate 2 fixed to the moving unit 430 transferred by the first transfer unit 410 is formed. Therefore, the deposition source nozzle unit 120 includes the plurality of deposition source nozzles 121 arranged along the first direction (+Y direction), and thus one deposition source nozzle 121 may be located along a second direction (for example, X-axis direction) that intersects with the first direction (+Y direction) on a plane (ZX plane) perpendicular to the first direction (+Y direction) and that is parallel to the substrate 2 fixed to the moving unit 430, which may significantly decrease the generation of a shadow when forming a pattern layer.

The patterning slit sheet 130 may be disposed so as to face the deposition source nozzle unit 120, and may have a structure in which a plurality of patterning slits are formed along one direction (X-axis direction). The patterning slit sheet 130 is located between the deposition source 110 and the substrate 2. The deposition material 115 that is evaporated in the deposition source 110 may pass through the deposition source nozzle unit 120 and the patterning slit sheet 130 so as to be deposited on the substrate 2, which is an object to be deposited on.

The patterning slit sheet 130 may be manufactured through etching or the like that is used in a method of manufacturing an FMM of the related art, e.g., as a stripe type mask. The patterning slit sheet 130 may be disposed so as to be separated from the deposition source 110 (and the deposition source nozzle unit 120 coupled to the deposition source 110) at a predetermined distance.

The inside of the chamber may be maintained in a high vacuum state, in the same manner as or in a similar manner to a case of FMM deposition, in order for the deposition material 115 discharged from the deposition source 110 to efficiently pass through the deposition source nozzle unit 120 and the patterning slit sheet 130 and to be deposited in a desired pattern onto the substrate 2. Thermal expansion of the patterning slit sheet 130 may be minimized by making the temperature of the patterning slit sheet 130 sufficiently low. For example, the temperature of the patterning slit sheet 130 may be, e.g., about equal to or less than 100° C., and lower than that of the deposition source 110. If the temperature of the patterning slit sheet 130 is increased, the size, position, and the like of the patterning slit of the patterning slit sheet 130 may be changed, which may cause the deposition material to be deposited onto the substrate 2 in a pattern different from a predetermined pattern.

The substrate 2, which is an object to be deposited on, is disposed within the chamber 101. The substrate 2 may be a substrate for a flat plate display apparatus, and may be a large area substrate such as a mother glass with which a plurality of flat plate display apparatuses may be formed.

In a deposition method using an FMM of the related art, the area of the FMM is the same as the area of a substrate and, as the size of the substrate increases, the size of the FMM increases. It may be difficult to manufacture the FMM, and sagging of a mask occurs due to the FMM weight, which may makes it difficult to form an intermediate layer having an exact predetermined pattern.

In the deposition apparatus according to the present example embodiment, deposition is performed while each of the plurality of deposition assemblies 100-5 to 100-9 and the substrate relatively move. While the first transfer unit 410 transfers the substrate 2 fixed to the moving unit 430 in the first direction (+Y direction), the plurality of deposition assemblies 100-5 to 100-9 separated from the substrate 2 at a predetermined distance sequentially deposit a material onto the substrate 2. Thus, the deposition is performed in a scanning manner while the substrate 2 (disposed so as to face the plurality of deposition assemblies 100-5 to 100-9) is transferred in a direction of an arrow A of FIG. 3. In the drawing, the deposition is performed while the substrate 2 moves within the chamber 101 in the +Y direction. However, the deposition may be performed, e.g., whereby the position of the substrate 2 is fixed, and the deposition assembly 100-1 may perform deposition while moving in the −Y direction.

In the deposition apparatus according to the present example embodiment, the size of the patterning slit sheet 130 may be set to be considerably smaller than the size of an FMM of the related art. In the deposition apparatus according to the present example embodiment, the deposition may be performed continuously, that is, in a scanning manner, while the substrate 2 moves along the Y-axis direction, even though the length of the patterning slit sheet 130 in the Y-axis direction is considerably shorter than the length of the substrate 2 in the Y-axis direction. Thus, the deposition may be sufficiently performed with respect to the greater part of the whole surface of the substrate 2.

Furthermore, the size of the patterning slit sheet 130 may be set to be considerably smaller than the size of the FMM of the related art. Thus, the manufacturing of the patterning slit sheet 130 may be facilitated. In processes including an etching process when manufacturing the patterning slit sheet 130, and a precise pulling process, a welding process, a moving process, a washing process, and the like after the etching process, the process of patterning of the slit sheet 130 having a small size may be advantageous as compared with a process relevant to a large area FMM. Such an advantage may be more significant as the size of a display apparatus to be manufactured increases.

As described above, each of the plurality of deposition assemblies 100-5 to 100-9, which is separated from the substrate 2 at a predetermined distance, deposits a material onto the substrate 2, while the first transfer unit 410 transfers the substrate 2 fixed to the moving unit 430 in the first direction (+Y direction). Thus, the patterning slit sheet 130 is disposed so as to be separated from the substrate 2 at a predetermined distance. The in a related art deposition apparatus using an FMM, the FMM and a substrate may come into contact with each other and cause an error. The deposition apparatus according to the present example embodiment may significantly increase a manufacturing speed by avoiding a time to tightly adhere a substrate and a mask to each other during a process.

As shown in the drawing, the upper housing 104 may have a mounting unit 104-1 that protrudes at both sides of the deposition source 110 and the deposition source nozzle unit 120. A sheet stage capable of adjusting the position of the patterning slit sheet 130 may be located on the mounting unit 104-1. The sheet stage may include the first stage 150 and the second stage 160, and the patterning slit sheet 130 may be disposed on the second stage 160.

The first stage 150 may adjust the position of the patterning slit sheet 130 in the X-axis direction and the Y-axis direction. The first stage 150 includes a plurality of actuators so as to shift the position of the patterning slit sheet 130 in the X-axis direction and Y-axis direction with respect to the upper housing 104. The second stage 160 may adjust the position of the patterning slit sheet 130 in the Z-axis direction. For example, the second stage 160 may include an actuator so as to adjust the position of the patterning slit sheet 130 along the Z-axis direction with respect to the first stage 150, that is, the upper housing 104.

The position of the patterning slit sheet 130 with respect to the substrate 2 may be adjusted through the sheet stage including the first stage 150 and the second stage 160, so that alignment between the substrate 2 and the patterning slit sheet 130, e.g., real-time alignment may be performed.

The upper housing 104, the first stage 150, and the second stage 160 may simultaneously guide a moving path of a deposition material so that the deposition material discharged through the deposition source nozzle 121 is not dispersed. The path of the deposition material is limited by the upper housing 104, the first stage 150, and the second stage 160, and thus the movement of the deposition material in the X-axis direction may be restricted.

Each of the plurality of deposition assemblies 100-5 to 100-9 may include a positional information obtaining unit. The positional information obtaining unit may include a camera 170 including, for example, a CCD. The camera 170 may obtain positional information regarding the position of the substrate 2 on the moving unit 430 transferred by the first transfer unit 410. For example, the camera 170 may obtain image information regarding a guard ring (not shown) which is an indicating line formed on the substrate 2. Thus, the camera 170 may confirm in real time a positional relationship between a mark (not shown) formed in the patterning slit sheet 130 and the guard ring formed on the substrate 2 so as to from data for causing the patterning slit sheet 130 and the substrate 2 to be exactly aligned on the XY plane.

The positional information obtained by the positional information obtaining unit is transmitted to the sheet stage, so that the sheet stage may adjust the position of the patterning slit sheet 130 in the X-axis direction and Y-axis direction with respect to the upper housing 104 through, for example, the first stage 150. The sheet stage adjusts the position of the patterning slit sheet 130 with respect to the substrate 2.

The position between the substrate 2 and the patterning slit sheet 130 may be confirmed in real time by using the positional information obtaining unit including the camera 170, and thus the substrate 2 and the patterning slit sheet 130 may be aligned in real time, which may help improve positional accuracy of a pattern. Such an alignment may be performed in each of the plurality of deposition assemblies 100-5 to 100-9, and thus when a patterned layer is formed through deposition in each of the plurality of deposition assemblies 100-5 to 100-9, the positional accuracy of the pattern may be improved.

Each of the plurality of prior deposition assemblies 100-1 to 100-4 or each of the plurality of post deposition assemblies 100-10 and 100-11 may deposit a layer to be commonly formed in the greater part of the whole surface of the substrate 2, instead of the patterned layer. Each of the plurality of prior deposition assemblies 100-1 to 100-4 or each of the plurality of post deposition assemblies 100-10 and 100-11 may include a deposition source, a deposition source nozzle unit, and a patterning slit sheet.

The deposition source or the deposition source nozzle unit of each of the plurality of prior deposition assemblies 100-1 to 100-4 or each of the plurality of post deposition assemblies 100-10 and 100-11 may have a similar configuration as the deposition source 110 or deposition source nozzle unit 120 of each of the plurality of deposition assemblies 100-5 to 100-9. The deposition source or the deposition source nozzle unit of each of the plurality of prior deposition assemblies 100-1 to 100-4 or each of the plurality of post deposition assemblies 100-10 and 100-11 has an elongated shape in a direction (X-axis direction) perpendicular to a direction (Y-axis direction) in which the first transfer unit 410 transfers the moving unit 430, and the plurality of deposition source nozzles of the deposition source nozzle unit may also be arranged in the X-axis direction in order to form a thin film having a uniform thickness, instead of a patterned deposition layer, on the substrate 2.

The patterning slit sheet of each of the plurality of prior deposition assemblies 100-1 to 100-4 or each of the plurality of post deposition assemblies 100-10 and 100-11 may have a different configuration from the patterning slit sheet 130 of each of the plurality of deposition assemblies 100-5 to 100-9. Each of the plurality of prior deposition assemblies 100-1 to 100-4 or each of the plurality of post deposition assemblies 100-10 and 100-11 deposits a layer to be commonly formed in the greater part of the whole surface of the substrate 2 instead of depositing a patterned layer. Thus, the patterning slit sheet may have an opening extending in a direction (X-axis direction), instead of a plurality of patterning slits.

The plurality of prior deposition assemblies 100-1 to 100-4 and the plurality of post deposition assemblies 100-10 and 100-11 deposits a layer to be commonly formed in the greater part of the whole surface of the substrate 2 instead of depositing a patterned layer. Thus, when the substrate 2 on the moving unit 430 transferred by the first transfer unit 410 reaches the patterning slit sheet of each of the plurality of prior deposition assemblies 100-1 to 100-4 or each of the plurality of post deposition assemblies 100-10 and 100-11, the plurality of prior deposition assemblies and the plurality of post deposition assemblies may perform deposition in a state where the position of the patterning slit sheet is fixed, without adjusting the position of the patterning slit sheet with respect to the substrate 2. Therefore, the plurality of prior deposition assemblies 100-1 to 100-4 and the plurality of post deposition assemblies 100-10 and 100-11 may not need the positional information obtaining unit or the sheet stage.

As described above, in each of the plurality of deposition assemblies 100-5 to 100-9, the position between the substrate 2 and the patterning slit sheet 130 is confirmed in real time by using the positional information obtaining unit including the camera 170, and the substrate 2 and the patterning slit sheet 130 are aligned in real time on the basis of the confirmed position. For this, before the substrate 2 on the moving unit 430 transferred by the first transfer unit 410 reaches the patterning slit sheet 130, the positional information obtaining unit including the camera 170 may obtain positional information regarding the position of the substrate 2 on the moving unit 430 transferred by the first transfer unit 410. The positional information obtaining unit including the camera 170 is located closer to the loading unit 200 than the patterning slit sheet 130 in each of the plurality of deposition assemblies 100-5 to 100-9. Thus, the sheet stage may adjust the position of the patterning slit sheet 130 before the substrate 2 on the moving unit 430 transferred by the first transfer unit 410 reaches the patterning slit sheet 130, according to the positional information obtained by the positional information obtaining unit.

The blocking member 140 may be disposed between the patterning slit sheet 130 and the deposition source 110 in order to prevent a material from being deposited in a non-film formation region of the substrate 2. Although not shown in detail in the drawing, the blocking member 140 may be constituted by two plates adjacent to each other. The non-film formation region of the substrate 2 is covered by the blocking member 140, which may prevent the material from being deposited in the non-film formation region of the substrate 2 without an additional structure. In addition, the sensor 180 for sensing a distance between the substrate 2 and the patterning slit sheet 130 may be used.

Figure 5:
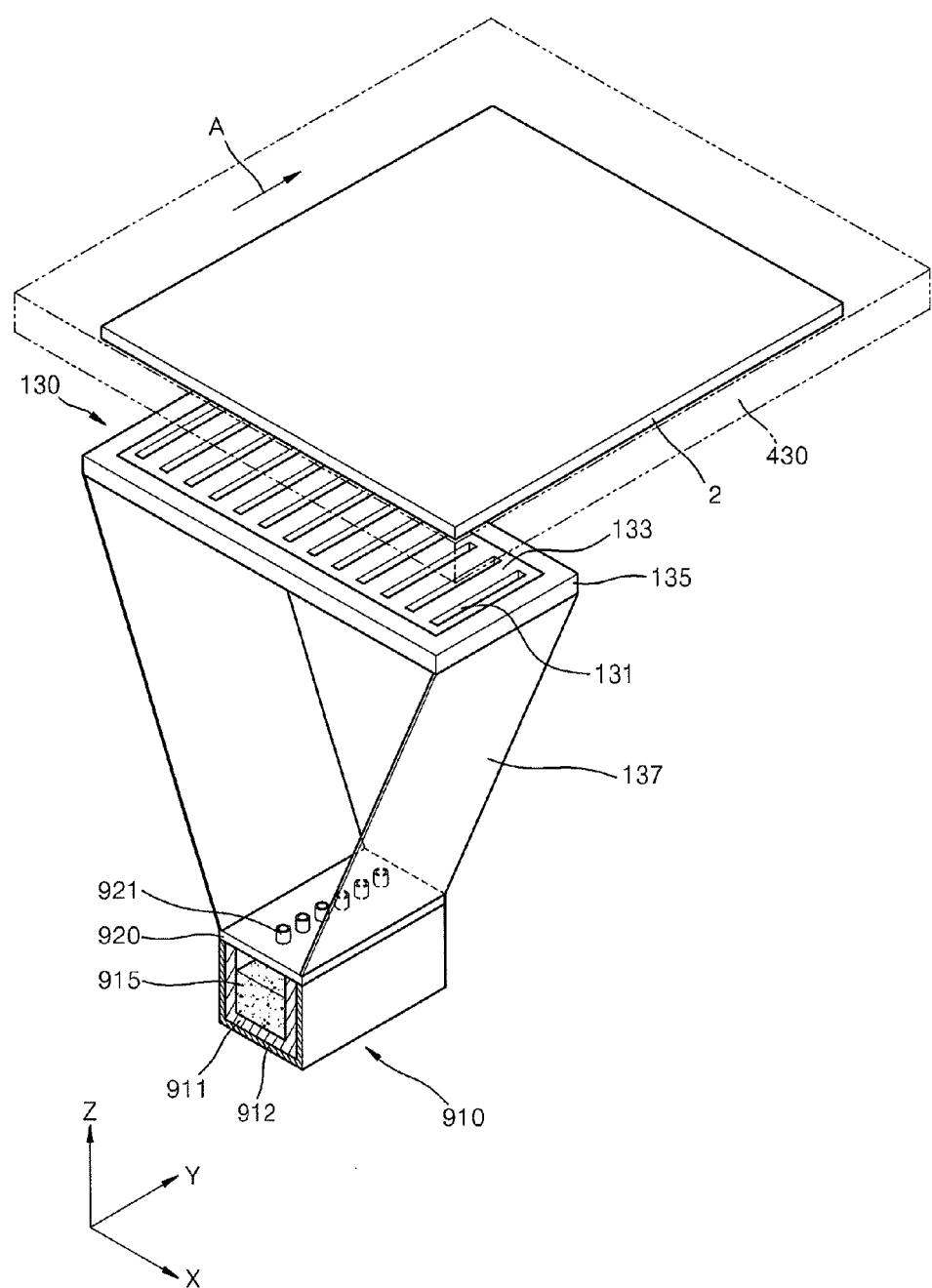
FIG. 5 illustrates a schematic perspective view showing a part of a deposition assembly, according to an example embodiment.

FIG. 5 illustrates a schematic perspective view showing a part of a deposition assembly of a deposition apparatus, according to an example embodiment. As shown in FIG. 5, the deposition source 110 and/or the deposition source nozzle unit 120 and the patterning slit sheet 130 may be coupled to each other by a connection member 137.

The patterning slit sheet 130 included in each of the above-mentioned plurality of deposition assemblies 100-5 to 100-9 may have a shape shown in FIG. 5. As shown in FIG. 5, the patterning slit sheet 130 may include a frame 135 substantially having, for example, a window frame shape, and a sheet 133 that is coupled to the frame 135 through welding or the like. A plurality of patterning slits 131 extending, for example, in the Y-axis direction may be formed the sheet 133 so as to be parallel with each other in the X-axis direction. The deposition material located within the furnace 111 of the deposition source 110 may be evaporated by the heater 112, may be discharged through the deposition source nozzle 121 of the deposition source nozzle unit 120, and may be deposited on the substrate via the patterning slits 131 of the patterning slit sheet 130.

Embodiments are also directed to a method of manufacturing an organic light-emitting display using the deposition apparatus.

A method of manufacturing an organic light-emitting display apparatus according to an example embodiment may include an operation of transferring the moving unit 430 into the chamber 101 by the first transfer unit 410 installed so as to enter the chamber 101 in a state where the substrate 2 is fixed to the moving unit 430, and an operation of forming a layer by causing deposition materials discharged from the plurality of deposition assemblies 100-5 to 100-9 to be sequentially deposited onto the substrate 2 while transferring the substrate 2 with respect to each of the plurality of deposition assemblies 100-5 to 100-9 in a state where each of the plurality of deposition assemblies 100-5 to 100-9 disposed within the chamber 101 is separated from the substrate 2 at a predetermined distance. Then, the moving unit 430, which is separated from the substrate 2, is returned to the second transfer unit 420 that is installed so as to enter the chamber 101, and then the moving unit 430 may be circularly transferred by the first transfer unit 410 and the second transfer unit 420.

In the method of manufacturing the organic light-emitting display apparatus, the plurality of deposition assemblies 100-5 to 100-9 may have the configurations of the plurality of deposition assemblies 100-5 to 100-9 described in the deposition apparatuses according to the above-described embodiments. In the operation of forming the layer, the sheet stage including the first stage 150 and the second stage 160 may adjust the position of the patterning slit sheet 130.

In the operation of forming the layer, the positional information obtaining unit may obtain positional information regarding the position of the substrate 2 on the moving unit 430 that is transferred by the first transfer unit 410 before the substrate 2 on the moving unit 430 transferred by the first transfer unit 410 reaches the patterning slit sheet 130. At this time, in each of the plurality of deposition assemblies 100-5 to 100-9, the sheet stage may adjust the position of the patterning slit sheet 130 before the substrate 2 on the moving unit 430 transferred by the first transfer unit 410 reaches the patterning slit sheet 130 according to the positional information obtained by the positional information obtaining unit.

The layer formed in this manner may be a layer patterned on the substrate 2. In the operation of forming the layer, there may be a need to form a layer integrally in the greater part of the whole surface of the substrate 2, instead of forming the layer patterned on the substrate 2. The layer may be formed by causing the first transfer unit 410 to transfer the substrate 2 with respect to the plurality of prior deposition assemblies 100-1 to 100-4 and/or the post deposition assemblies 100-10 and 100-11 in a state where the plurality of prior deposition assemblies 100-1 to 100-4 and/or the post deposition assemblies 100-10 and 100-11 having the above-described configuration are separated from the substrate 2 at a predetermined distance. In this case, the layer patterned by the plurality of deposition assemblies 100-5 to 100-9 may be formed on the substrate 2 between the operation of forming the layer on the substrate 2 by the plurality of prior deposition assemblies 100-1 to 100-4 and the operation of forming the layer on the substrate 2 by the post deposition assemblies 100-10 and 100-11.

In a case where the layer is formed on the substrate 2 through the plurality of prior deposition assemblies 100-1 to 100-4 and/or the post deposition assemblies 100-10 and 100-11, when the substrate 2 on the moving unit 430 transferred by the first transfer unit 410 reaches the patterning slit sheet of each of the plurality of prior deposition assemblies 100-1 to 100-4 and/or the post deposition assemblies 100-10 and 100-11, deposition may be performed in a state where the position of the patterning slit sheet is fixed.

Figure 6:
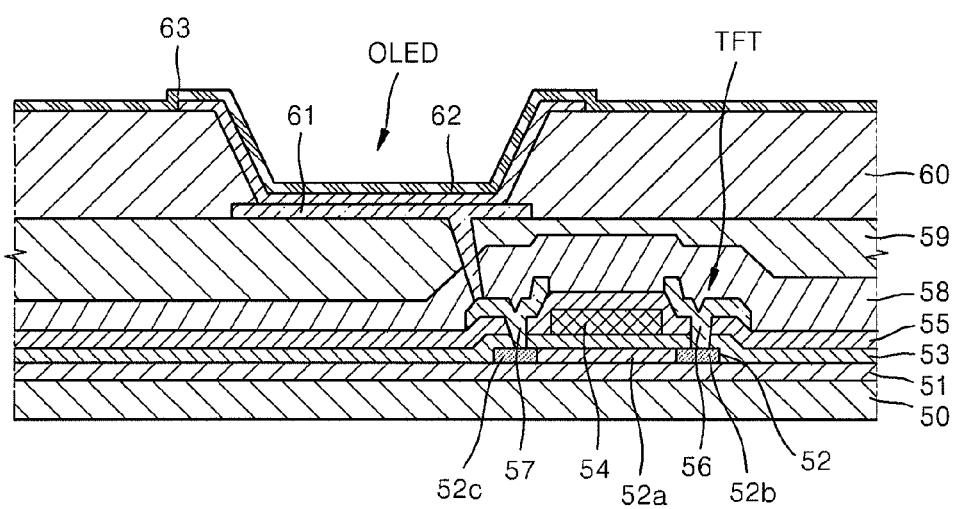
FIG. 6 illustrates a schematic cross-sectional view showing an organic light-emitting display apparatus that is manufactured using the deposition apparatus of FIG. 1.

FIG. 6 illustrates a schematic cross-sectional view showing an organic light-emitting display apparatus that is manufactured using the deposition apparatus of FIG. 1, according to an example embodiment.

Referring to FIG. 6, various components of the organic light-emitting display apparatus are formed on a substrate 50. Here, the substrate 50 may be the substrate 2 described in FIG. 3 and the like, or may be a part that is cut from the substrate 2. The substrate 50 may be formed of a transparent material, for example, a glass material or a plastic material, a metal material, etc.

On the substrate 50, common layers such as a buffer layer 51, a gate insulating layer 53, and an insulating interlayer 55 may be formed on the greater part of the whole surface of the substrate 50, a patterned semiconductor layer 52 including a channel region 52*a*, a source contact region 52*b*, and a drain contact region 52*c* may be formed, and a gate electrode 54, a source electrode 56, and a drain electrode 57 that are components of a thin film transistor TFT may be formed together with the patterned semiconductor layer.

In addition, a protective layer 58 covering the thin film transistor TFT and a planarization layer 59 that is located on the protective layer 58 and has a substantially flat top surface may be formed on the whole surface of the substrate 50. A patterned pixel electrode 61, a counter electrode 63 corresponding to substantially the whole surface of the substrate 50, and an organic light-emitting display diode OLED including an intermediate layer 62 that is interposed between the pixel electrode 61 and the counter electrode 63 and has a multi-layered structure with an emission layer may be formed on the planarization layer 59. A part of the intermediate layer 62 may be a common layer corresponding to the substantially the whole surface of the substrate 50, and the other part thereof may be a layer that is patterned so as to correspond to the pixel electrode 61. The pixel electrode 61 may be electrically connected to the thin film transistor TFT through a via hole. The pixel definition layer 60 that covers an edge of the pixel electrode 61 and has an opening for defining each pixel area may be formed on the planarization layer 59 so as to correspond to substantially the whole surface of the substrate 50.

In the organic light-emitting display apparatus, at least some of the components may be formed using the deposition apparatuses and the method of manufacturing the organic light-emitting display apparatus according to the above-described embodiments.

For example, the intermediate layer 62 may be formed using the deposition apparatuses and the method of manufacturing the organic light-emitting display apparatus according to the above-described embodiments. For example, a hole injection layer (HIL), a hole transport layer (HTL), an emission layer (EML), an electron transport layer (ETL), an electron injection layer (EIL), and the like that may be included in the intermediate layer 62 may be formed using the deposition apparatuses and the method of manufacturing the organic light-emitting display apparatus according to the above-described embodiments.

For example, when the layers of the intermediate layer 62 are formed, the HIL or the HTL that may be common layers corresponding to substantially the whole surface of the substrate 50 may be formed through the plurality of prior deposition assemblies 100-1 to 100-4, the EML and the like that may be pattern layers patterned so as to correspond to the pixel electrode 61 may be formed through the plurality of deposition assemblies 100-5 to 100-9, and the ETL and the EIL that may be common layers corresponding to substantially the whole surface of the substrate 50 may be formed through the plurality of post deposition assemblies 100-10 and 100-11.

At this time, when the EML and the like that may be pattern layers patterned so as to correspond to the pixel electrode 61 are formed through the plurality of deposition assemblies 100-5 to 100-9, positional information regarding the position of the substrate 2 is obtained by the positional information obtaining unit, and the substrate 2 is caused to reach the patterning slit sheet 130, and thus the position of the patterning slit sheet 130 is adjusted before the substrate 2 reaches the patterning slit sheet 130, or the position of the patterning slit sheet 130 is continuously adjusted while the substrate passes through the patterning slit sheet 130, thereby allowing the patterned EML and the like to be formed at an exact predetermined position.

As shown in FIG. 5, the patterned EML and the like formed in this manner may be formed using the patterning slit sheet 130 in which the plurality of patterning slits 131 are disposed along the X-axis direction, and thus the EML and the like formed in this manner may have a linear pattern.

By way of summation and review, a first electrode, a second electrode, and an intermediate layer may be formed using, e.g., independent deposition. To manufacture the organic light-emitting display apparatus using a deposition method, an intermediate layer with a predetermined pattern and the like may be formed by tightly adhering a fine metal mask (FMM) (which has an opening having the same pattern as, or a similar pattern to, patterns of an intermediate layer and the like that are to be formed on a substrate) to the substrate, and depositing materials such as the intermediate layer and the like. However, in a deposition method of the related art using the FMM, when a large area organic light-emitting display apparatus is manufactured using a large area substrate or when a plurality of organic light-emitting display apparatuses are simultaneously manufactured using a large area mother-substrate, a large area FMM may be needed. In this case, if a mask sags due to its own weight, an intermediate layer and the like may not be formed in an exact pattern. Further, it may take a long time to align a large substrate and a large FMM, tightly adhere them to each other, perform deposition on them, and separate the substrate and the FMM from each other, which may result in an increase in manufacturing time and a decrease in production efficiency.

As described above, embodiments relate to a deposition apparatus that may allow a deposition material to be deposited at an exact position during a deposition process, an organic light-emitting display apparatus, and a method of manufacturing the organic light-emitting display apparatus. In deposition performed on a large area substrate, the deposition apparatus according to an embodiment may allow the deposition to be exactly performed on a predetermined region. For example, even in a case of an organic light-emitting display apparatus including a substrate having a size equal to or more than 40 inches, the deposition apparatus may allow an intermediate layer to be exactly formed, which may help realize a high quality organic light-emitting display apparatus.

As described above, embodiments may provide a deposition apparatus capable of allowing a deposition material to be deposited at an exact position in a deposition process, a method of manufacturing an organic light-emitting display apparatus using the deposition apparatus, and the organic light-emitting display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display apparatus, the method comprising:
   transferring a moving unit into a chamber by a first transfer unit that is installed so as to enter the chamber in a state where a substrate is fixed to the moving unit;
   forming a layer by causing deposition materials discharged from a plurality of deposition assemblies to be sequentially deposited onto the substrate while the first transfer unit transfers the substrate with respect to the plurality of deposition assemblies in a state where the substrate is separated from the plurality of deposition assemblies disposed within the chamber at a predetermined distance; and
   returning the moving unit separated from the substrate by a second transfer unit that is installed so as to enter the chamber,
   wherein each of the plurality of deposition assemblies includes:
   a deposition source configured to emit the deposition material;
   a deposition source nozzle unit that is disposed toward the first transfer unit from the deposition source and has a deposition source nozzle formed therein;
   a patterning slit sheet that is disposed so as to face the deposition source nozzle unit and in which a plurality of patterning slits are disposed in one direction;
   a positional information obtaining unit configured to obtain positional information regarding a position of the substrate on the moving unit transferred by the first transfer unit; and
   a sheet stage configured to adjust a position of the patterning slit sheet with respect to the substrate on the moving unit transferred by the first transfer unit, and
   wherein the forming of a layer includes depositing material onto the substrate while adjusting the position of-the patterning slit sheet by the sheet stage, according to the positional information obtained by the positional information obtaining unit.

2. The method as claimed in claim 1, wherein the forming of a layer includes forming a layer by causing, in each of the plurality of deposition assemblies, the positional information obtaining unit to obtain the positional information regarding the position of the substrate on the moving unit transferred by the first transfer unit before the substrate on the moving unit transferred by the first transfer unit reaches the patterning slit sheet.

3. The method as claimed in claim 2, wherein the forming of a layer includes forming a layer by causing, in each of the plurality of deposition assemblies, the sheet stage to adjust the position of the patterning slit sheet before the substrate on the moving unit transferred by the first transfer unit reaches the patterning slit sheet, according to the positional information obtained by the positional information obtaining unit.

4. The method as claimed in claim 1, wherein the forming of a layer includes forming a layer by causing the deposition materials discharged from a plurality of prior deposition assemblies to be sequentially deposited onto the substrate while the first transfer unit transfers the substrate with respect to the plurality of prior deposition assemblies in a state where the plurality of prior deposition assemblies disposed within the chamber are separated from the substrate at a predetermined distance, and then by causing the deposition materials discharged from the plurality of deposition assemblies to be sequentially deposited onto the substrate.

5. The method as claimed in claim 4, wherein each of the plurality of prior deposition assemblies includes:
   a deposition source configured to emit the deposition material;
   a deposition source nozzle unit that is disposed toward the first transfer unit from the deposition source and has a deposition source nozzle formed therein;
   a patterning slit sheet that is disposed so as to face the deposition source nozzle unit and has an opening extending in one direction.

6. The method as claimed in claim 4, wherein the forming of a layer includes causing deposition to be performed in a state where the position of the patterning slit sheet of each of the plurality of prior deposition assemblies is fixed, while transferring the substrate on the moving unit by the first transfer unit through the patterning slit sheet of each of the plurality of prior deposition assemblies.

7. The method as claimed in claim 1, wherein:
the sheet stage includes a first stage and a second stage, and
the patterning slit sheet is on the second stage.

8. The method as claimed in claim 7, wherein adjusting the position of the patterning slit sheet by the sheet stage includes adjusting the position of the patterning slit sheet in an X-axis direction and a Y-axis direction using the first stage, the patterning slit sheet extending in the X-axis direction and the Y-axis direction.

9. The method as claimed in claim 8, wherein adjusting the position of the patterning slit sheet in the X-axis direction and the Y-axis direction includes using a plurality of actuators included in the first stage.

10. The method as claimed in claim 8, wherein adjusting the position of the patterning slit sheet by the sheet stage includes adjusting the position of the patterning slit sheet in a Z-axis direction using the second stage, the Z-axis direction being orthogonal to the X-axis direction and the Y-axis direction.

11. The method as claimed in claim 10, wherein adjusting the position of the patterning slit sheet in the Z-axis direction includes using an actuator included in the second stage.

12. A method of manufacturing an organic light-emitting display apparatus, the method comprising:
transferring a moving unit into a chamber by a first transfer unit that is installed so as to enter the chamber in a state where a substrate is fixed to the moving unit;
forming a layer by causing deposition materials discharged from a plurality of deposition assemblies to be sequentially deposited onto the substrate while the first transfer unit transfers the substrate with respect to the plurality of deposition assemblies in a state where the substrate is separated from the plurality of deposition assemblies disposed within the chamber at a predetermined distance; and
returning the moving unit separated from the substrate by a second transfer unit that is installed so as to enter the chamber,
wherein each of the plurality of deposition assemblies includes:
a deposition source configured to emit the deposition material;
a deposition source nozzle unit that is disposed toward the first transfer unit from the deposition source and has a deposition source nozzle formed therein;
a patterning slit sheet that is disposed so as to face the deposition source nozzle unit and in which a plurality of patterning slits are disposed in one direction;
a positional information obtaining unit configured to obtain positional information regarding a position of the substrate on the moving unit transferred by the first transfer unit; and
a sheet stage configured to adjust a position of the patterning slit sheet with respect to the substrate on the moving unit transferred by the first transfer unit,
wherein the forming of a layer includes forming a layer while adjusting the position of the patterning slit sheet by the sheet stage, according to the positional information obtained by the positional information obtaining unit, and
wherein adjusting the position of the patterning slit sheet by the sheet stage includes adjusting the position of the patterning slit sheet continuously while the substrate passes through the patterning slit sheet.

* * * * *